(12) United States Patent
Takeda

(10) Patent No.: US 8,405,209 B2
(45) Date of Patent: Mar. 26, 2013

(54) SEMICONDUCTOR DEVICE WITH VARYING BUMP DENSITY REGIONS AND METHOD OF MANUFACTURING THE SAME

(75) Inventor: Kunihiro Takeda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 354 days.

(21) Appl. No.: 12/588,394

(22) Filed: Oct. 14, 2009

(65) Prior Publication Data

US 2010/0123244 A1    May 20, 2010

(30) Foreign Application Priority Data

Nov. 17, 2008  (JP) ................................ 2008-293191

(51) Int. Cl.
*H01L 23/48* (2006.01)
(52) U.S. Cl. ................ 257/737; 257/738; 257/E23.068; 257/E23.069
(58) Field of Classification Search .......... 257/737–738, 257/E23.068, E23.069, E23.07, E23.021, 257/E23.033
See application file for complete search history.

(56) References Cited

U.S. PATENT DOCUMENTS

| 2007/0080456 | A1* | 4/2007 | Chang ........................... 257/738 |
| 2008/0217770 | A1  | 9/2008 | Fukuda |
| 2008/0241994 | A1* | 10/2008 | Shimoaka ..................... 438/108 |
| 2010/0090333 | A1* | 4/2010 | Hayashi ........................ 257/693 |

FOREIGN PATENT DOCUMENTS

| JP | 2005-012065 (A) | 1/2005 |
| JP | 2007-142017 | 6/2007 |
| JP | 2007-242782 | 9/2007 |
| JP | 2008-227020 (A) | 9/2008 |

OTHER PUBLICATIONS

Japanese Notification of Reasons for Refusal dated Sep. 10, 2012, with English-language translation.

* cited by examiner

*Primary Examiner* — Tucker Wright
(74) *Attorney, Agent, or Firm* — McGinn IP Law Group, PLLC

(57) ABSTRACT

Provided are a semiconductor device capable of reducing stress due to a density difference in the arrangement of bumps, and a method of manufacturing the semiconductor device. The semiconductor device includes: a wiring board including an electrode terminal group; a semiconductor chip including a bump formation surface where a bump group is formed and being mounted on the wiring board by using the bump group. The bump formation surface includes a first region where an area density of a region having bumps arranged therein is a first density, a second region where an area density of a region having bumps arranged therein is a second density lower than the first density, and a third region provided in a border portion between the first and second regions. In the third region, an area density of a region having bumps arranged therein is above the second density and below the first density.

14 Claims, 7 Drawing Sheets

SEMICONDUCTOR DEVICE WITH VARYING BUMP DENSITY REGIONS AND METHOD OF MANUFACTURING THE SAME

BACKGROUND OF THE INVENTION

1. Field of the Invention

The present invention relates to a semiconductor device and a method of manufacturing the semiconductor device.

2. Description of the Related Art

A semiconductor package (a semiconductor device) includes a semiconductor chip and a wiring board on which the semiconductor chip is mounted. The semiconductor chip is provided with a bump formation surface on which protruding bumps are formed. Solder, for example, is used as a material for the bumps. The semiconductor chip is mounted on the wiring board by using the bump formation surface.

In such a semiconductor device, stress is applied to the semiconductor chip and the bumps at the time of mounting the semiconductor chip or after the mounting in some cases. For example, in a case where flux is used to form the bumps, the semiconductor chip is mounted on the wiring substrate by a heat treatment such as an IR reflow treatment. In this mounting, stress sometimes occurs due to such reason as a difference in thermal expansion coefficient between the bump portions and the other portions. Such stress may cause a bump crack or a chip crack. Thus, reduction of such stress is desired.

As a related art, Japanese Patent Application Publication No. 2007-242782 discloses a technique relating to a semiconductor device in which bumps serving as external connecting terminals are joined to a semiconductor substrate. An object of this technique is to reduce or absorb stress which the bumps receive from a mounting board and at the same time ensure stable electrical connection.

Another related art is Japanese Patent Application Publication No. 2007-142017. This patent document discloses that bumps between a chip and a wiring board are arranged in concentric circles, and have diameters changing from the center circle toward the outermost circle in order to disperse stress occurring in the circumferential portion of the chip.

In some cases, stress occurring in a bump formation surface of a semiconductor chip notably increases due to a difference in the density of bumps arranged on the bump formation surface.

FIG. 1 is a schematic view, showing an example of an arrangement of bumps 101 on a bump formation surface 102. In the example shown in FIG. 1, the bumps 101 are uniformly arranged. In this case, there is no difference in the density of the bumps, and thus stress relating to the density of the bumps occurs less.

FIG. 2 is a schematic view showing another example of an arrangement of the bumps 101 on the bump formation surface 102. In the example shown in FIG. 2, the bump formation surface 102 includes a first region 103 in which the bumps 101 are densely arranged and a second region 104 in which the bumps 101 are sparsely arranged. FIG. 3 shows a simulation result of a stress distribution which occurs at the time of mounting a semiconductor chip and after the mounting. The simulation result in FIG. 3 is obtained by use of a semiconductor chip having the bump formation surface 102 shown in FIG. 2. As shown in FIG. 3, stress occurring portions 105 occur around a border between the first region 103 and the second region 104.

Apparently, there is a problem that stress at a problematic level for a product occurs when the arrangement of the bumps 101 has a notable density difference as shown in FIG. 3.

SUMMARY

A semiconductor device according to the present invention includes: a wiring board (1); and a semiconductor chip which includes a bump formation surface (7) having a bump group (3) formed thereon and which is mounted on the wiring board (1) by using the bump group (3). The bump formation surface (7) includes: a first region (9) in which an area density of a region having bumps (3) arranged therein is a first density; a second region (10) in which an area density of a region having bumps (3) arranged therein is a second density lower than the first density; and a third region (11) provided in a border portion between the first region (9) and the second region (10). In the third region (11), an area density of a region having bumps (3) arranged therein is higher than the second density and is lower than the first density.

According to the present invention, stress occurring between the first region (9) and the second region (10) due to a difference in the density of the bumps is reduced by providing the third region (11). Thus, a bump crack and a chip crack due to the stress can be suppressed.

A semiconductor chip according to the present invention includes a bump formation surface (7) which faces a wiring board (1) when mounted on the wiring board (1) and which has a bump group (3) formed thereon, the bump group (3) electrically connected to the wiring board (1). In the semiconductor chip, the bump formation surface (7) includes: a first region (9) in which an area density of a region having bumps (3) arranged therein is a first density; a second region (10) in which an area density of a region having bumps (3) arranged therein is a second density lower than the first density; and a third region (11) for reducing stress occurring at the time of mounting the semiconductor chip on the wiring board (1). The third region (11) is provided in a border portion between the first region (9) and the second region (10). In the third region (11), an area density of a region having bumps (3) arranged therein is higher than the second density and is lower than the first density.

A wiring board according to the present invention includes a chip mounting surface (12) on which a semiconductor chip is to be mounted. Electrode terminals (5) are arranged on the chip mounting surface (12) in a pattern corresponding to the bump formation surface (7) of the semiconductor chip described above.

A method of manufacturing a semiconductor device according to the present invention includes the steps of: preparing a wiring board (1) including an electrode terminal group (5); preparing a semiconductor chip including a bump formation surface (7) which has a bump group (3) formed thereon, the bump formation surface (3) including a first region (9) in which an area density of a region having bumps (3) arranged therein is a first density, a second region (10) in which an area density of a region having bumps (3) arranged therein is a second density lower than the first density, and a third region (11) which is for reducing stress occurring at the time of mounting the semiconductor chip on the wiring board (1), which is provided in a border portion between the first region (9) and the second region (10), and in which an area density of a region having bumps (3) arranged therein is higher than the second density and is lower than the first density; and mounting the semiconductor chip on the wiring board (1) by heat treatment so that the bump group (3) faces the electrode terminal group (5).

The present invention provides a semiconductor device capable of reducing stress even when an arrangement of bumps has a density difference, and a method of manufacturing such a semiconductor device.

DESCRIPTION OF THE PREFERRED EMBODIMENTS (First Embodiment)

Figure 4:
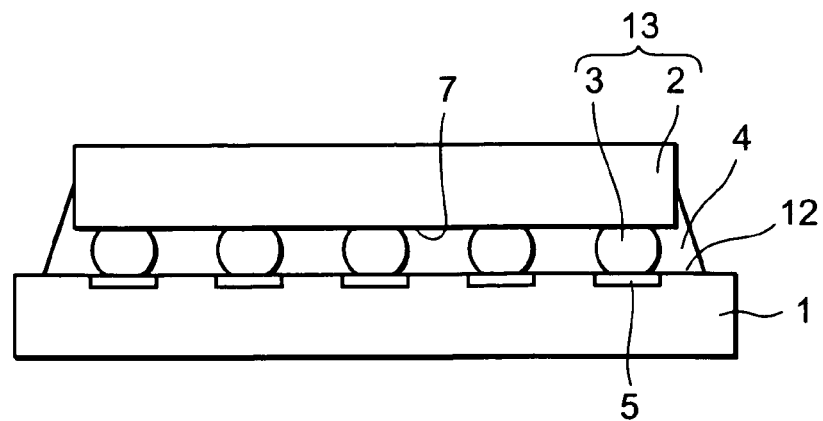
FIG. 4 is a cross-sectional view showing a semiconductor device according to a first embodiment.

A first embodiment according to the present invention will be described with reference to the drawings. FIG. 4 is a cross-sectional view showing a semiconductor device according to the present embodiment.

As shown in FIG. 4, the semiconductor device of the present embodiment includes a wiring board and a semiconductor chip 13. The wiring board 1 has a chip mounting surface 12. On the chip mounting surface 12, multiple electrode terminals 5 are formed as an electrode terminal group. Meanwhile, the semiconductor chip 13 includes a chip substrate 2 having a semiconductor integrated circuit formed thereon. The chip substrate 2 is provided with a bump formation surface 7. Multiple bumps 3 are formed on the bump formation surface 7 as a bump 3 group. The semiconductor chip 13 is mounted on the wiring board 1 so that the bump formation surface 7 would face the chip mounting surface 12. An arrangement pattern of the bumps 3 on the bump formation surface 7 is the same as an arrangement pattern of the electrode terminals 5 on the chip mounting surface 12. The bumps 3 and the electrode terminals 5 are electrically connected to each other. Moreover, a space between the semiconductor chip 13 and the wiring board 1 is sealed with sealing resin 4. Connecting parts between the semiconductor chip 13 and the wiring substrate 1 are protected by the sealing resin 4.

As shown in FIG. 4, the semiconductor device according to the present embodiment is a so-called flip-chip semiconductor package.

Figure 5:
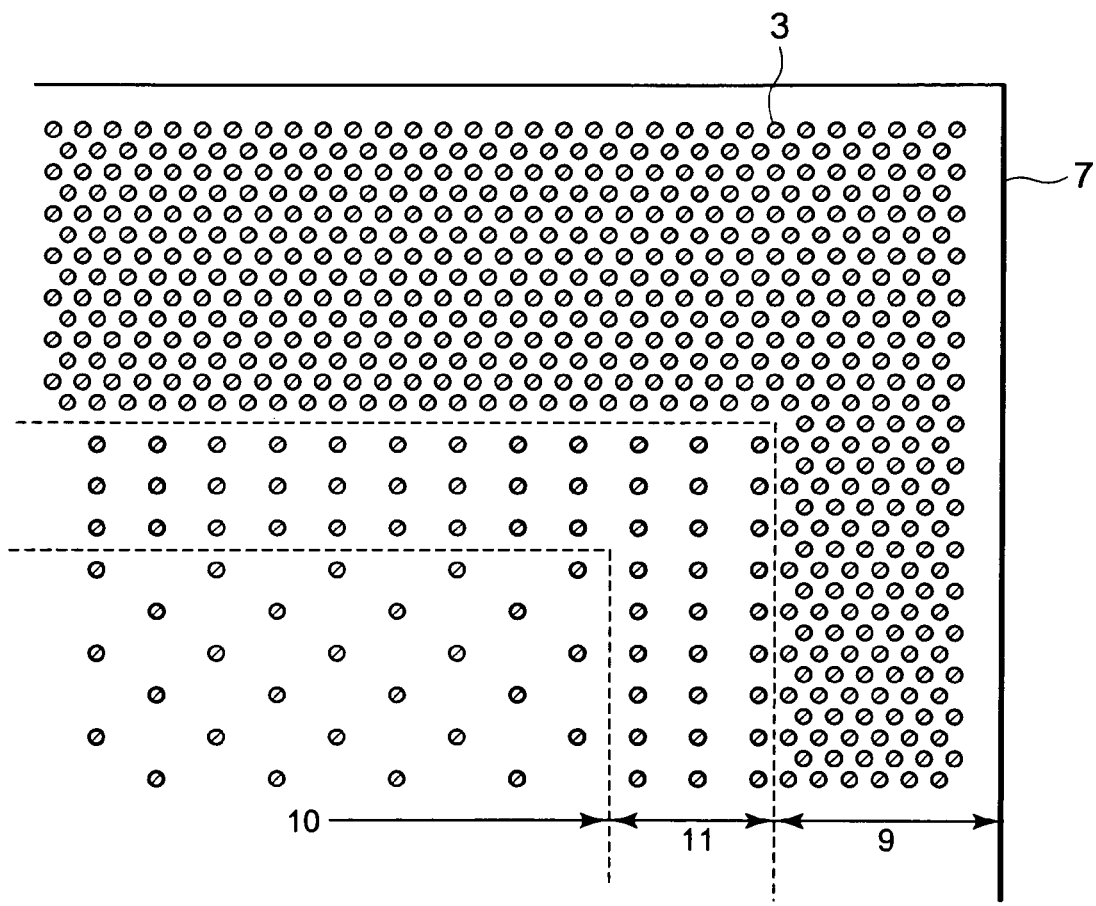
FIG. 5 is a schematic view showing an arrangement of bumps in a part of a bump formation surface.

FIG. 5 is a schematic view showing the arrangement of the bumps in a part of the bump formation surface 7. As shown in FIG. 5, the bump formation surface 7 includes a first region 9, a second region 10, and a third region 11.

In the first region 9, the area density of a region having the bumps 3 arranged thereon is a first density.

In the second region 10, the area density of a region having the bumps 3 arranged thereon is a second density. The second density is lower than the first density.

The third region 11 is provided to suppress stress occurring due to a difference in densities of the bumps 3 between the first region 9 and the second region 10. The third region 11 is located in a border portion between the first region 9 and the second region 10. In the third region 11, the area density of a region having the bumps 3 arranged thereon is a third density. The third density is higher than the second density, and is lower than the first density. In other words, the area density increases in the regions having the bumps 3 arranged thereon in the order of the first region 9, the third region 11, and the second region 10.

Note that, the area density is the proportion, in a predetermined region, of the area of a portion where the bumps are arranged to the sum of the area of the portion where the bumps are arranged and the area of a portion where no bumps are arranged.

Moreover, the bumps 3 in the first region 9, the second region 10, and the third region 11 all have the same size. In other words, the first region 9, the second region 10, and the third region 11 have different numbers of the bumps 3 per unit area. Accordingly, the area densities of the respective regions having the bumps arranged thereon are different from each other. In each of the first region 9, the second region 10, and the third region 11, the bump 3 are arranged at almost equal intervals.

To manufacture a semiconductor device such as one described above, firstly, the semiconductor chip 13 and the wiring substrate 1 are prepared. In the preparation of the semiconductor chip 13, the bumps 3 are formed by using flux. Thereafter, the semiconductor chip 13 is mounted on the wiring board 1. At this time, a heat treatment such as an IR reflow treatment is performed.

In the heat treatment, stress is likely to occur due to a difference in thermal expansion coefficients between portions corresponding to the bump 3 and the other portions. However, in the present embodiment, the third region 11 is provided in the border portion between the first region 9 and the second region 10 as shown in FIG. 5. Thus, the density of the bumps 3 in the bump formation surface 7 changes stepwisely. By this arrangement, the portion where the density of the bumps 3 suddenly changes is eliminated, thereby reducing the stress. As a result a bump crack and a chip crack are suppressed.

Figure 1:
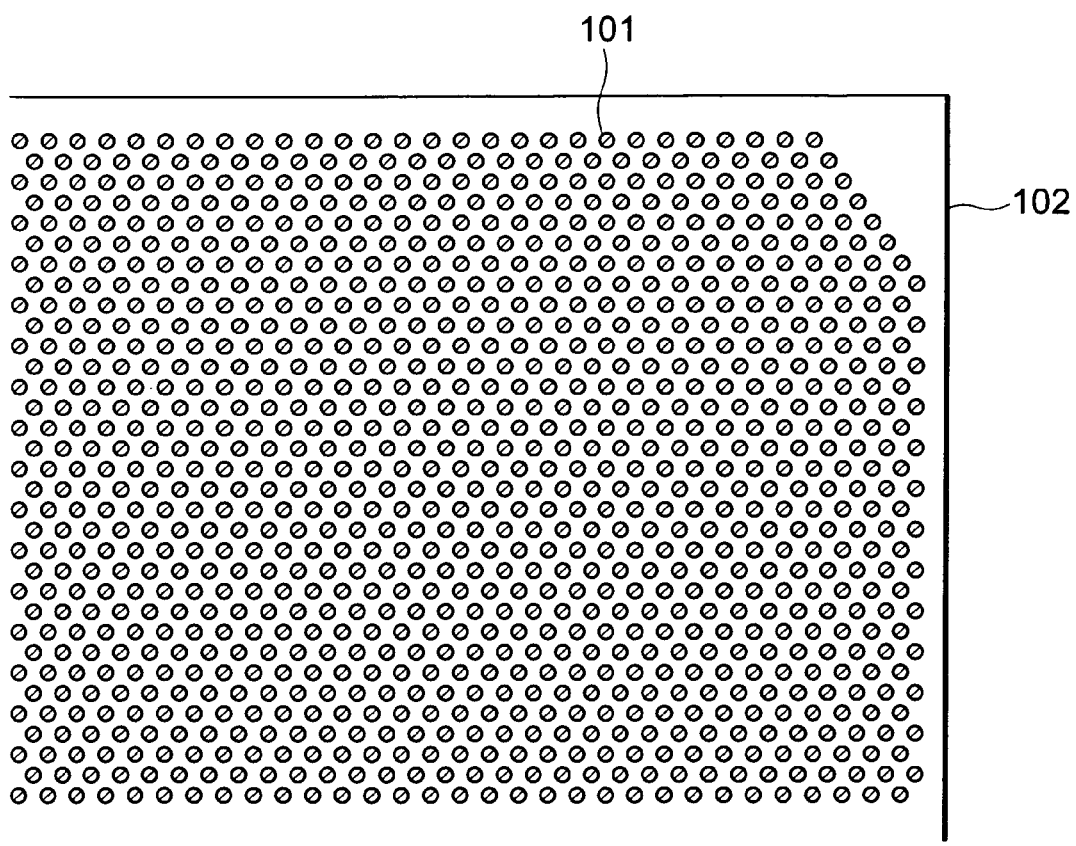
FIG. 1 is a schematic view showing an example of an arrangement of bumps on a bump formation surface.
Figure 2:
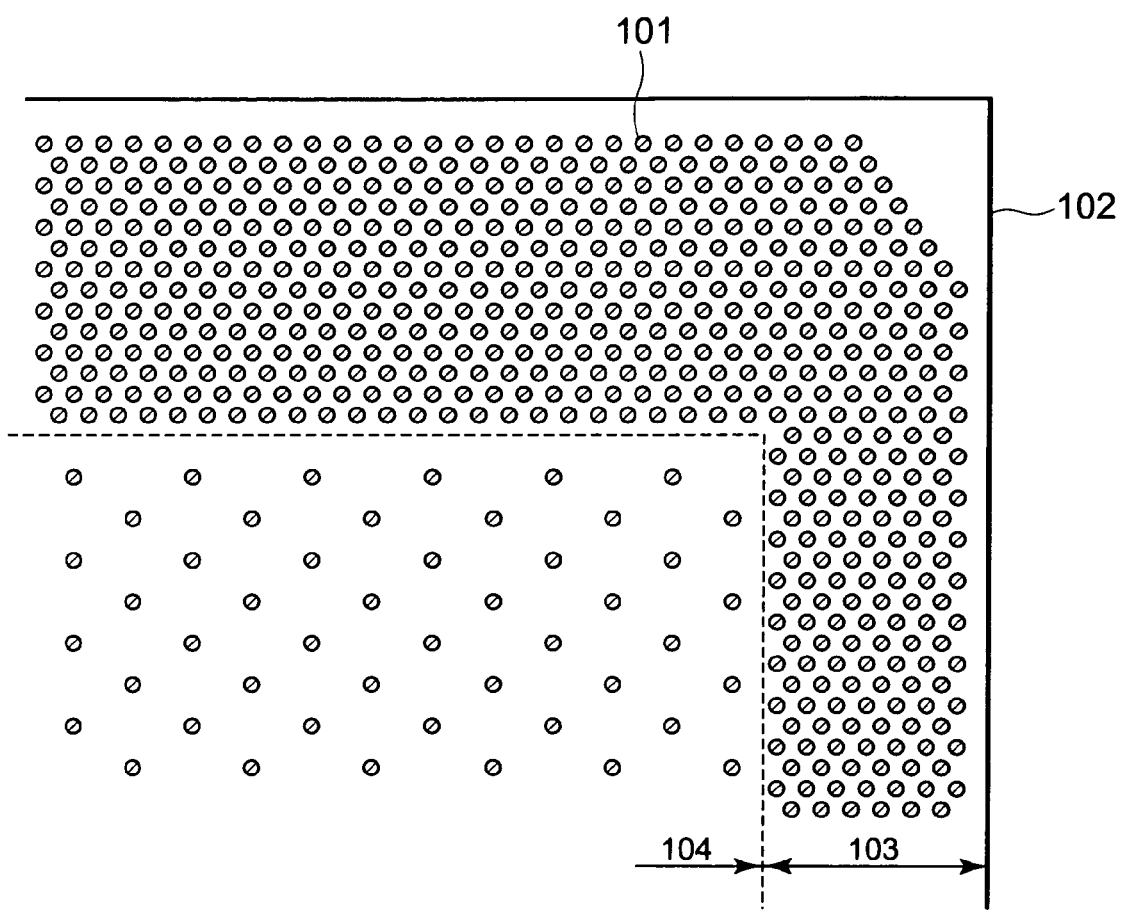
FIG. 2 is a schematic view showing another example of the arrangement of the bumps on the bump formation surface.
Figure 3:
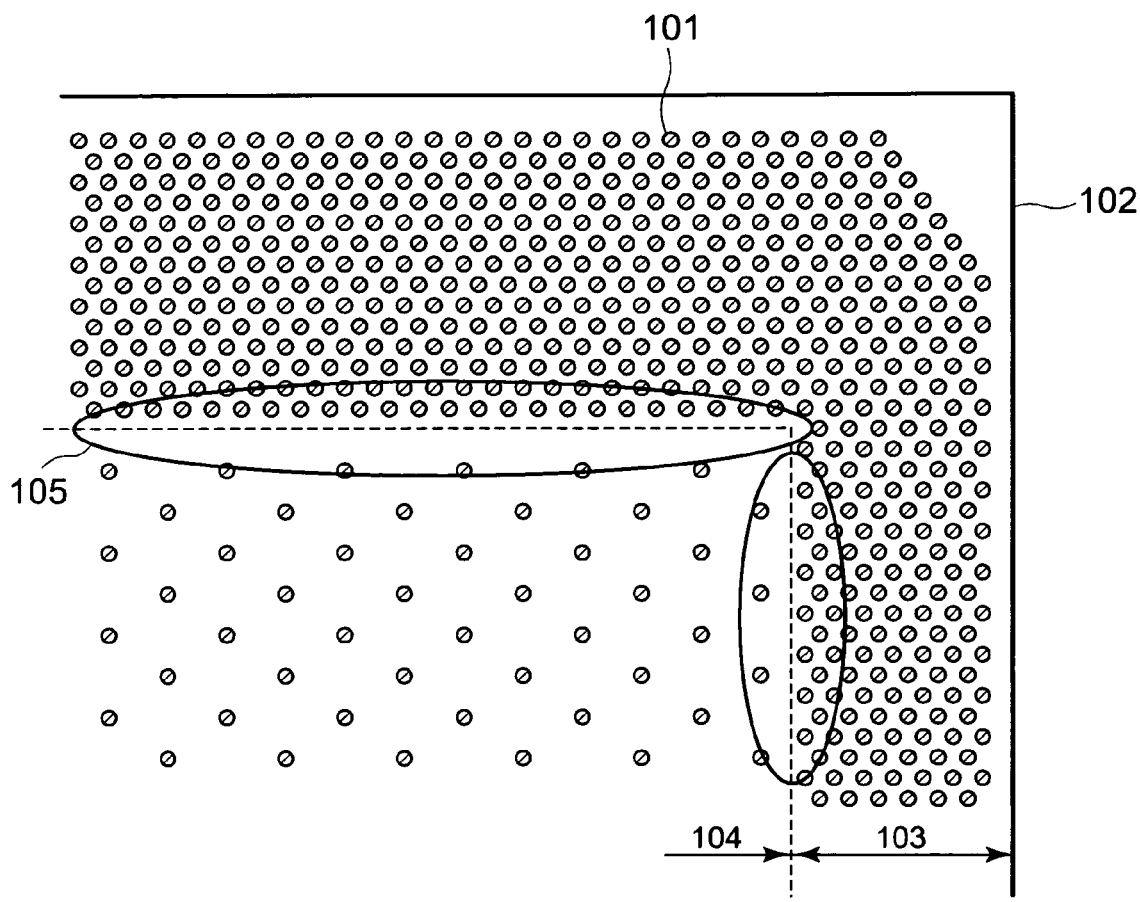
FIG. 3 is a simulation result of a stress distribution.
Figure 6:
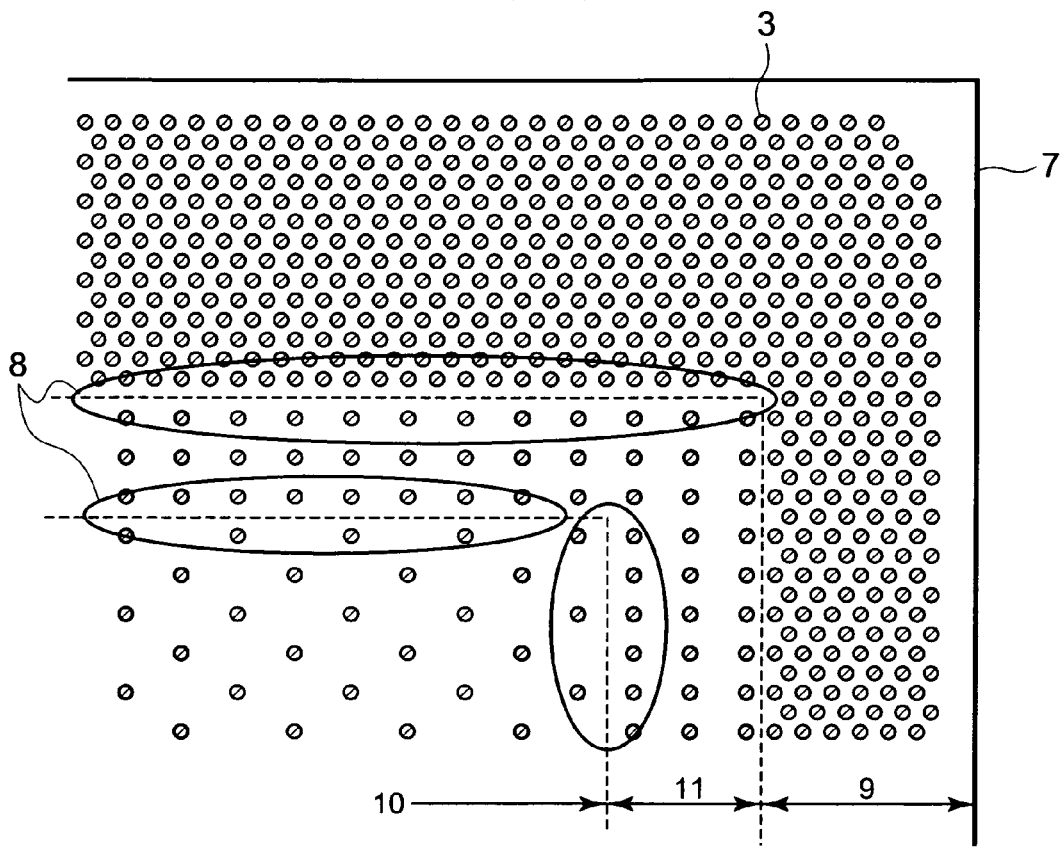
FIG. 6 is a simulation result of a stress distribution in the first embodiment.

FIG. 6 shows a simulation result of a stress distribution occurring in the present embodiment. Stress occurring portions 8 occur in a border portion between the first region 9 and the third region 11 and in a border portion between the third region 11 and the second region 10. The stress occurring portions 8 are dispersed compared to a case where the third region 11 is not provided (see FIG. 3).

Figure 7:
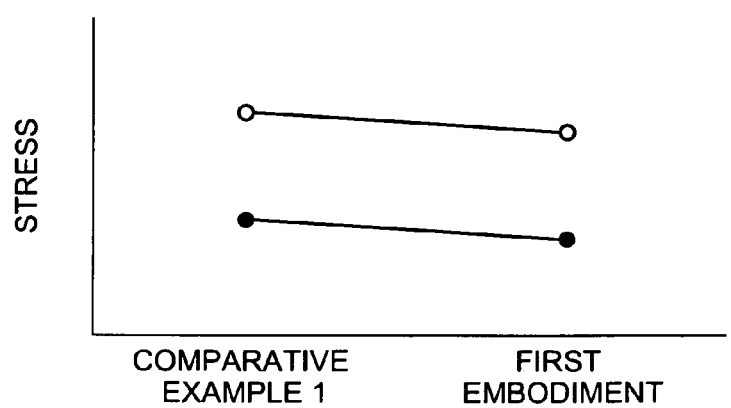
FIG. 7 is a simulation result of the amount of stress.

FIG. 7 shows a simulation result of the amount of stress. In FIG. 7, the vertical axis indicates the amount of stress, and the horizontal axis indicates the present embodiment (the first embodiment) and Comparative Example 1. Comparative Example 1 is an example in which the region corresponding to the third region 11 is replaced with the second region. In FIG. 7, a white circle for the first embodiment indicates stress in the border portion between the first region 9 and the third region 11, and a black circle for the first embodiment indicates stress in the border portion between the third region 11 and the second region 10. As to Comparative Example 1, a white circle and a black circle each indicate stress in a portion corresponding to the portion indicated for the present embodiment.

As shown in FIG. 7, the amount of the stress is reduced in the present embodiment compared to Comparative Example 1 in both the border portion between the first region 9 and the third region 11 and the border portion between the third region 11 and the second region 10. The fact that the stress is reduced by providing the third region 11 is confirmed from the simulation result.

In the present embodiment, the case where the semiconductor chip 13 is flip-chip mounted on the wiring substrate 1 is described. However, the present invention is not limited to this, and it should be understood that the present invention can be applied to any case where a semiconductor chip is mounted on a chip, a substrate or the like by using bumps.

(Second Embodiment)

Figure 8:
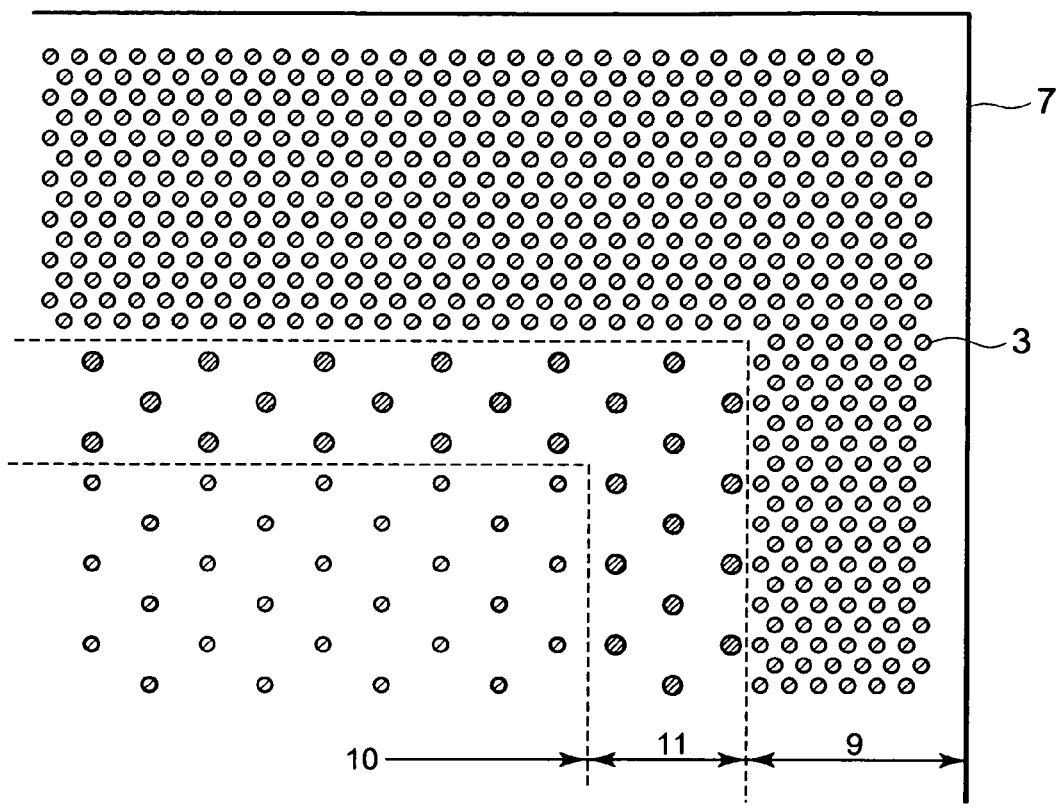
FIG. 8 is a schematic view showing a bump formation surface of a semiconductor device according to a second embodiment.

Next, a second embodiment will be described. FIG. 8 shows a bump formation surface 7 of a semiconductor device according to the second embodiment. In the present embodiment, the size and the arrangement of bumps 3 in a third region 11 are different from those in the first embodiment. The other points may be the same as the first embodiment, and thus the detailed description thereof is omitted here.

In the present embodiment, as in the case of the first embodiment, the region of the third region 11 having the bumps 3 arranged thereon has an area density (third density) which is higher than a second density and is lower than a first density. However, in the present embodiment, the number of the bumps 3 arranged per unit area in the third region 11 is the same as that in the second region 10. Meanwhile, the size of each of the bumps 3 arranged in the third region 11 is larger than the size of each of the bumps 3 arranged in the first region 9 and the second region 10. Note that, the bumps 3 in the first region 9 and the bumps 3 in the second region 10 are all the same in size.

In other words, in the present embodiment, the bumps 3 of the third region 11 and the bumps 3 of the second region 10 are different in size. Thus, the density of the bumps in the bump formation surface 7 changes stepwisely.

In the present embodiment, stress can also be reduced, and a bump crack and a chip crack can be suppressed, as in the case of the first embodiment.

Figure 9:
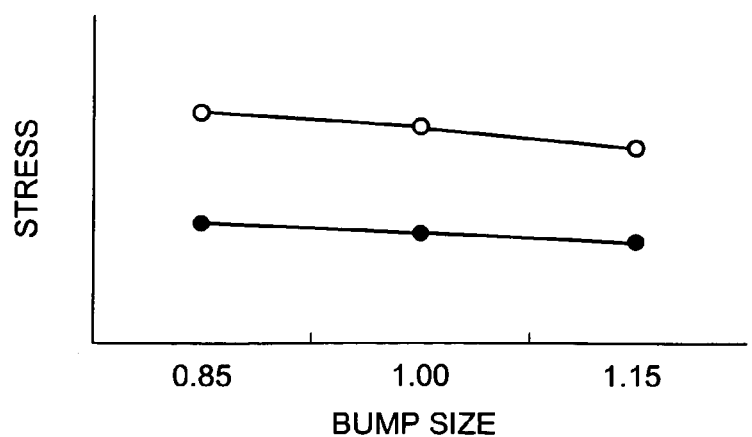
FIG. 9 is a simulation result which shows a relation between bump size and stress.

FIG. 9 is a simulation result which shows a relation between the bump size in the third region 11 and stress. In FIG. 9, the horizontal axis indicates the size of each of the bumps 3 arranged in the third region 11, and the vertical axis indicates the amount of stress. Moreover, as in the case of the first embodiment, each of white circles indicates stress in the border portion between the first region 9 and the third region 11, and each of black circles indicates stress in the border portion between the third region 11 and the second region 10. The bump size is 1.00 in the first region 9 and the second region 10. The number of the bumps per unit area in the third region 11 is the same as that in the second region 10.

As shown in FIG. 9, the amount of stress is the smallest when the bump size in the third region 11 is set at 1.15, and is the largest when the bump size in the third region 11 is set at 0.85. Thus, the fact that the stress is reduced by increasing the bump size in the third region 11 is confirmed.

(Third Embodiment)

Figure 10:
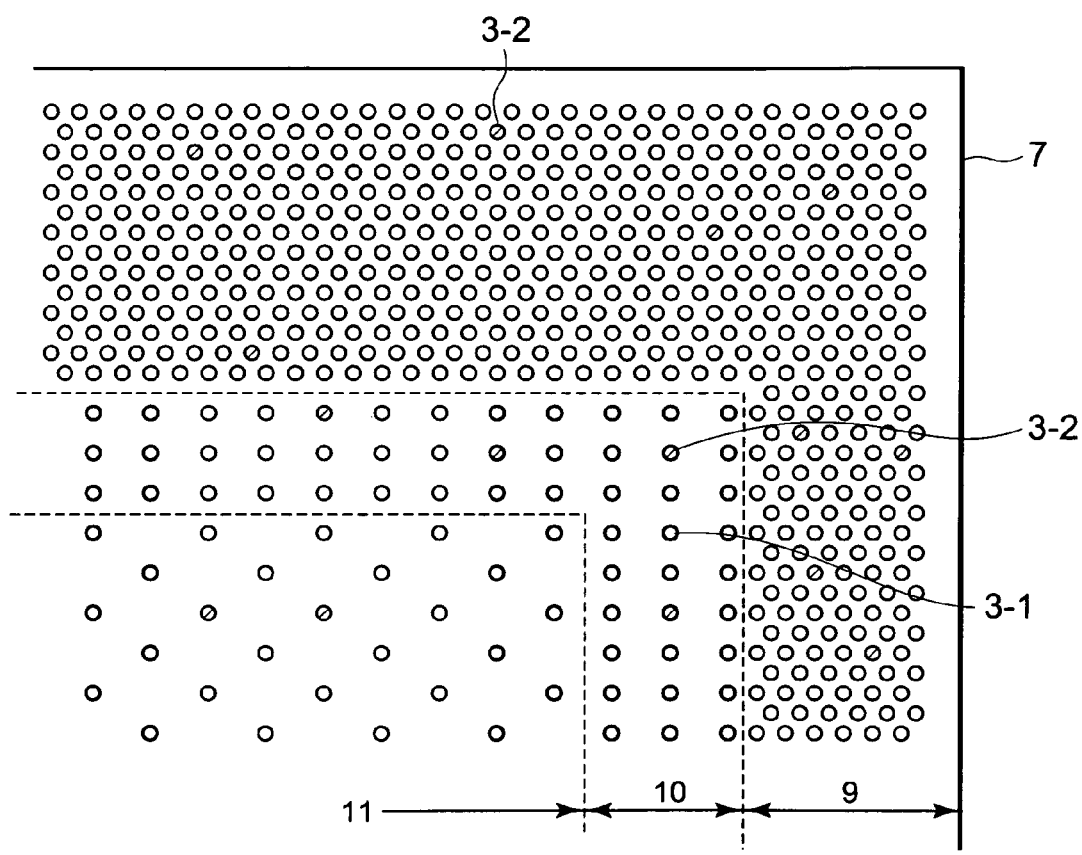
FIG. 10 is a schematic view showing a bump formation surface of a semiconductor device according to a third embodiment.

Next, a third embodiment of the present invention will be described. FIG. 10 shows a bump formation surface 7 of a semiconductor device according to the third embodiment. In the present embodiment, a bump group provided on the bump formation surface 7 includes actual bumps 3-1 and dummy bumps 3-2. The other points maybe the same as the above-described embodiments, and thus the detailed description thereof is omitted here.

The actual bumps 3-1 are bumps used for electrical connection between a semiconductor chip 13 and a wiring board 1. On the other hand, the dummy bumps 3-2 are provided to control the area density of a region where the bumps are arranged, and are not used for the electrical connection between the semiconductor chip 13 and the wiring board 1.

According to the present embodiment, the stress can be reduced by the same effects as the above-described embodiments. In addition, the area density of a region where the bumps 3 are arranged can be controlled by the dummy bumps 3-2. Accordingly, the present embodiment is advantageous in that a layout of the bumps 3 is less restricted.

Although the inventions has been described above in connection with several preferred embodiments thereof, it will be appreciated by those skilled in the art that those embodiments are provided solely for illustrating the invention, and should not be relied upon to construe be appended claims in a limiting sense.

What is claimed is:

1. A semiconductor device comprising:
 a wiring board;
 a semiconductor chip mounted on the wiring board, the semiconductor chip including a bump formation surface;
 a plurality of first bumps provided within a first region of the bump formation surface, the first bumps being arranged in a first area density;
 a plurality of second bumps provided within a second region of the bump formation surface, the second bumps being arranged in a second area density; and
 a plurality of third bumps arranged between the first region and the second region of the bump formation surface, the third bumps including:
  a first row of the third bumps;
  a second row of the third bumps, the second row of third bumps being arranged between the first row of third bumps and the first bumps; and
  a third row of the third bumps, the third now of third bumps being arranged between the first row of third bumps and the second bumps,
 wherein the third bumps are arranged in a third area density being higher than the second area density and being lower than the first area density.

2. The semiconductor device according to claim 1, wherein said wiring board includes an electrode terminal group,
 wherein the bump formation surface comprises a bump group comprising the plurality of first, second, and third bumps, and
 wherein said semiconductor chip is mounted on said wiring board so that said bump group faces said electrode terminal group.

3. The semiconductor device according to claims 1, wherein a number of bumps of the plurality of third bumps formed per unit area in said third region is larger than a number of bumps of the plurality of second bumps formed per unit area in said second region, and is smaller than a number of bumps of the plurality of first bumps formed per unit area in said first region.

4. The semiconductor device according to claims 1, wherein a size of each bump of the plurality of third bumps formed in said third region is larger than a size of each bump of the plurality of second bumps formed in said second region.

5. The semiconductor device according to claim 1, wherein said plurality of the first, second and third pumps form a bump group that includes an actual bump which is electrically connected to said wiring board and a dummy bump which is not electrically connected to said wiring board.

6. A wiring board comprising a chip mounting surface on which a semiconductor chip is to be mounted,
 wherein electrode terminals are arranged on said chip mounting surface in a pattern corresponding to said bump formation surface of said semiconductor chip according to claim 5.

7. A method of manufacturing a semiconductor device, said semiconductor device being a device according to claim 1, wherein said plurality of first bumps are arranged at almost equal intervals in said first region, said plurality of second bumps are arranged at almost equal intervals in said second region, and said plurality of third bumps are arranged at almost equal intervals in said third region.

8. The semiconductor device according to claim 1, wherein the first row of third bumps comprises a first number of bumps, and the second row of third bumps comprises a second number of bumps.

9. The semiconductor device according to claim 1, wherein the second row of third bumps is disposed above the first row of third bumps and out of sequence with the first row of third bumps, and the third row of third bumps is disposed above the second row of third bumps and in sequence with the first row of third bumps.

10. The semiconductor device according to claim 1, wherein the plurality of first, second, and third bumps each comprise bumps of a same size.

11. The semiconductor device according to claim 1, wherein the first, second, and third area densities change stepwisely.

12. The semiconductor device according to claim 1, wherein a size of the plurality of first bumps is approximately equal to a size of the plurality of second bumps.

13. The semiconductor device according to claim 12, wherein a size of the third plurality of bumps is larger than the size of the plurality of first and second bumps.

14. A semiconductor chip comprising a bump formation surface which faces a wiring board when mounted on said wiring board and which has a bump group formed thereon, said bump group electrically connected to said wiring board,
wherein said bump formation surface includes:
a plurality of first bumps provided within a first region of the bump formation surface, the first bumps being arranged in a first area density;
a plurality of second bumps provided within a second region of the bump formation surface, the second bumps being arranged in a second area density; and
a plurality of third bumps arranged between the first region and the second region of the bump formation surface, the third bumps being arranged in a third area density, the third area density being higher than the second area density and being lower than the first area density,
wherein the third bumps include;
a first row of the third bumps;
a second row of the third bumps, the second row of third bumps being arranged between the first row of third bumps and the first bumps; and
a third row of the third bumps, the third row of third bumps being arranged between the first row of third bum s and the second bumps.

* * * * *